United States Patent
Henley

(10) Patent No.: US 7,462,526 B2
(45) Date of Patent: Dec. 9, 2008

(54) METHOD FOR FABRICATING SEMICONDUCTOR DEVICES USING STRAINED SILICON BEARING MATERIAL

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 401 days.

(21) Appl. No.: 11/149,783

(22) Filed: Jun. 9, 2005

(65) Prior Publication Data

US 2005/0227425 A1    Oct. 13, 2005

Related U.S. Application Data

(63) Continuation-in-part of application No. 10/992,596, filed on Nov. 17, 2004, now Pat. No. 7,354,815.

(60) Provisional application No. 60/579,723, filed on Jun. 14, 2004, provisional application No. 60/523,372, filed on Nov. 18, 2003.

(51) Int. Cl.
H01L 21/00    (2006.01)

(52) U.S. Cl. .................. 438/199; 438/197; 438/198

(58) Field of Classification Search .......... 438/197–199
See application file for complete search history.

(56) References Cited

U.S. PATENT DOCUMENTS

| | | | | |
|---|---|---|---|---|
| 5,823,990 | A * | 10/1998 | Henley | 604/22 |
| 6,013,563 | A | 1/2000 | Henley et al. | |
| 6,033,974 | A * | 3/2000 | Henley et al. | 438/526 |
| 6,184,111 | B1 * | 2/2001 | Henley et al. | 438/514 |
| 6,284,631 | B1 * | 9/2001 | Henley et al. | 438/526 |
| 6,291,313 | B1 * | 9/2001 | Henley et al. | 438/458 |
| 6,455,397 | B1 | 9/2002 | Belford | |
| 6,486,041 | B2 * | 11/2002 | Henley et al. | 438/458 |

(Continued)

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

(Continued)

*Primary Examiner*—Laura M Menz
(74) *Attorney, Agent, or Firm*—Townsend and Townsend and Crew LLP

(57) ABSTRACT

A method of manufacturing an integrated circuit on semiconductor substrates, e.g., silicon wafer. The method includes providing a semiconductor substrate characterized by a first lattice with a first structure and a first spacing. In a specific embodiment, the semiconductor substrate has an overlying film of material with a second lattice with a second structure and a second spacing, the second spacing placing the film of material in a strain mode characterized by a first tensile and/or compressive mode along a single film surface crystal axis across a first portion of the film of material relative to the semiconductor substrate with the first structure and the first spacing. The method patterns a predetermined region of the first portion of the film of material to cause the first tensile and/or compressive mode in the first portion of the film of material to change to a second tensile and/or compressive mode in a resulting patterned portion of the first portion of the film of material. In a preferred embodiment, the patterns are made using a masking and etching process.

25 Claims, 17 Drawing Sheets

U.S. PATENT DOCUMENTS

| | | | |
|---|---|---|---|
| 6,514,836 B2 | 2/2003 | Belford | |
| 6,621,131 B2 * | 9/2003 | Murthy et al. | 257/408 |
| 6,790,747 B2 * | 9/2004 | Henley et al. | 438/458 |
| 7,094,666 B2 * | 8/2006 | Henley et al. | 438/457 |
| 7,147,709 B1 * | 12/2006 | Ong et al. | 117/3 |
| 2001/0007790 A1 * | 7/2001 | Henley et al. | 438/514 |
| 2001/0026997 A1 * | 10/2001 | Henley et al. | 438/458 |
| 2002/0090758 A1 * | 7/2002 | Henley et al. | 438/110 |
| 2003/0113983 A1 * | 6/2003 | Henley et al. | 438/458 |
| 2005/0070071 A1 * | 3/2005 | Henley et al. | 438/459 |
| 2005/0118754 A1 * | 6/2005 | Henley | 438/197 |
| 2005/0136584 A1 * | 6/2005 | Boyanov et al. | 438/199 |
| 2005/0227425 A1 * | 10/2005 | Henley | 438/198 |
| 2005/0233545 A1 * | 10/2005 | Henley et al. | 438/458 |
| 2006/0024917 A1 * | 2/2006 | Henley et al. | 438/455 |
| 2006/0160329 A1 * | 7/2006 | Henley et al. | 438/457 |
| 2007/0037323 A1 * | 2/2007 | Henley et al. | 438/149 |
| 2007/0051299 A1 * | 3/2007 | Ong et al. | 117/43 |

OTHER PUBLICATIONS

Lee et al. "Strained silicon thin-film transistors fabricated on glass", Applied Physics Letters 86, 103504 (2005).

Krivokapic et al., "Strain Relaxation in Narrow Width Strained Silicon Devices with Poly and Metal Gates", Electrochemical Society Proceedings 2004-07, vol. pp. 459-469, Pennington, New Jersey USA (2004).

* cited by examiner

1. Semiconductor Substrate Example (No Strain)

2. Semiconductor Substrate Example (Biaxial Strain)

3. Semiconductor Substrate Example (Uniaxial Strain)

4. Semiconductor Substrate Example (Uniaxial Strain)

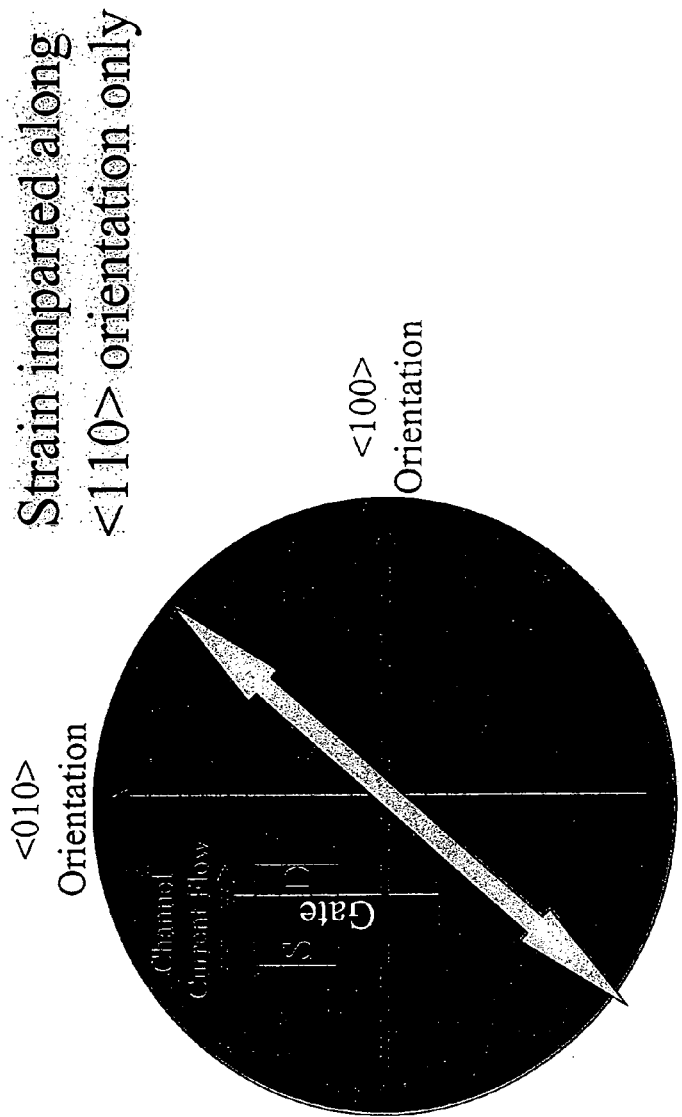
FIGURE U
5. <100> Device Orientation (on <110> Uniaxial Strain)

6. <1 -1 0> Device Orientation (orthogonal to <110> Uniaxial Strain),

6. <110> Device Orientation (parallel to <110> Uniaxial Strain)

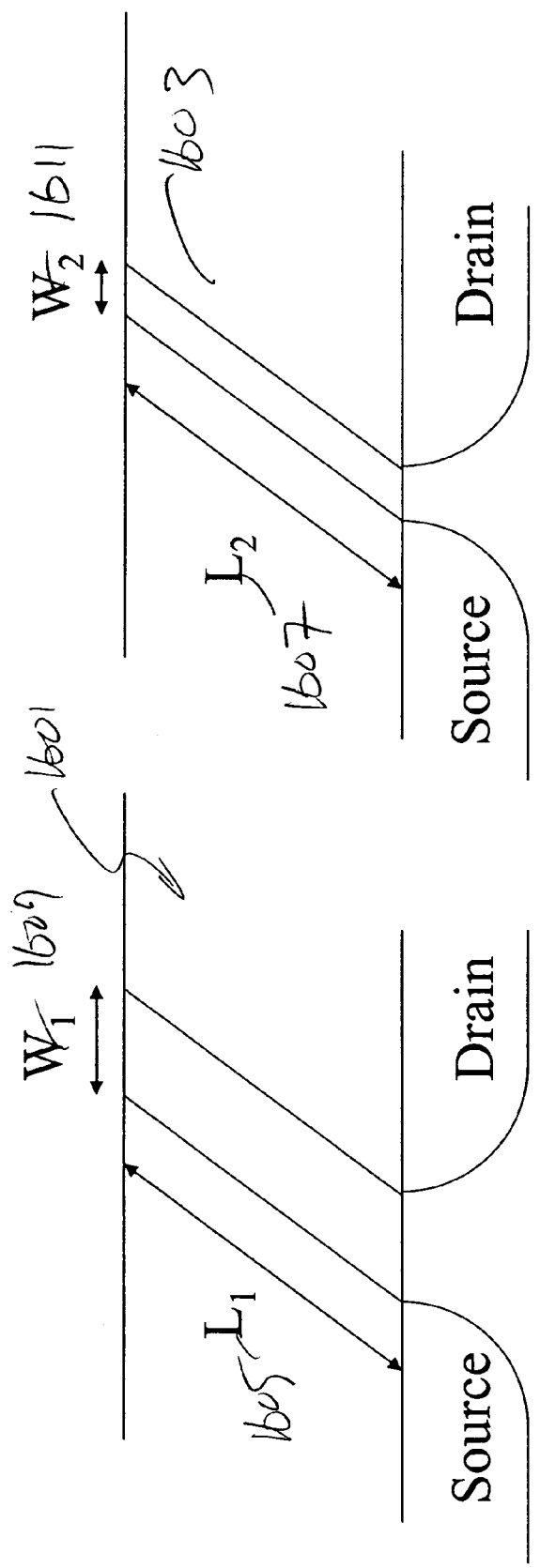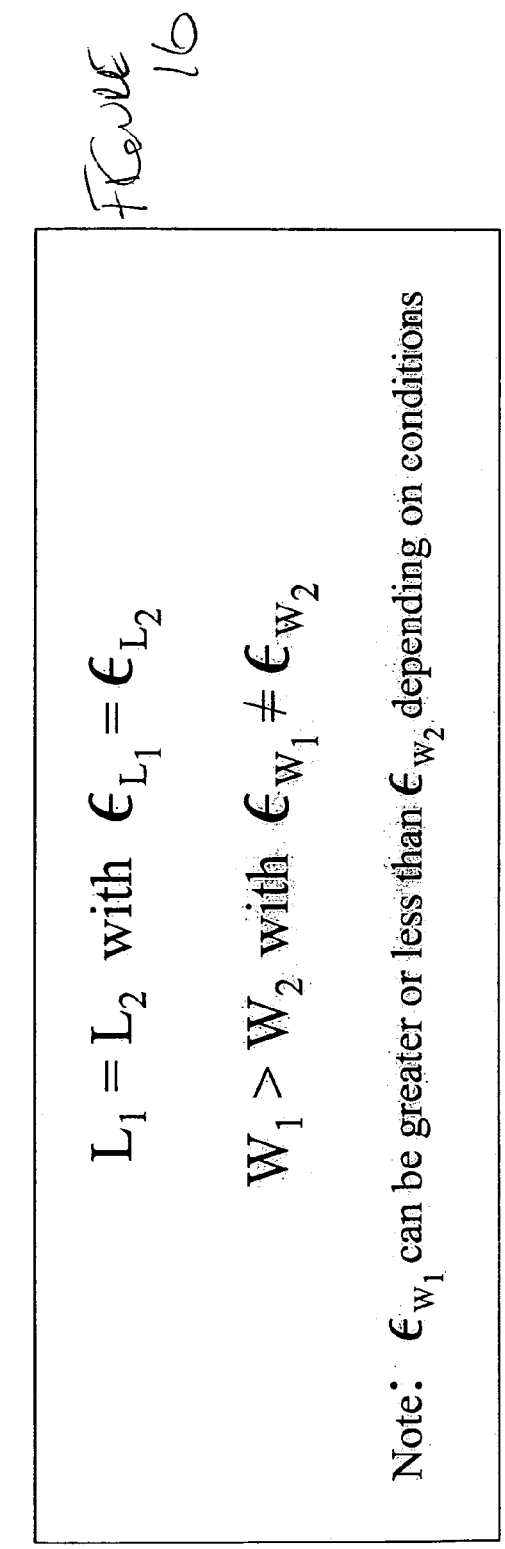
FIGURE 16

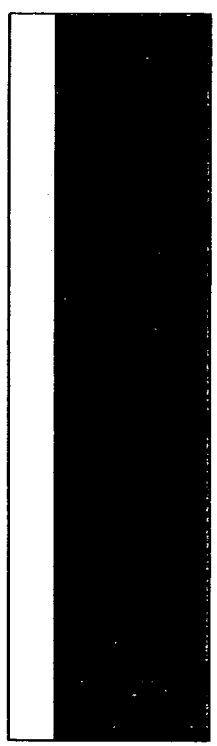  
FIGURE 17 1703

METHOD FOR FABRICATING SEMICONDUCTOR DEVICES USING STRAINED SILICON BEARING MATERIAL

CROSS-REFERENCE TO RELATED APPLICATION

This application is a continuation in part and also claims priority to U.S. application Ser. No. 10/992,596 filed Nov. 17, 2004, which claims priority to U.S. Provisional Ser. Nos. 60/523,372 filed Nov. 18, 2003 and 60/579,723 filed Jun. 14, 2004, all commonly assigned, and hereby incorporated by reference for all purposes.

BACKGROUND OF THE INVENTION

The present invention is directed to integrated circuits and their processing for the manufacture of semiconductor devices. More particularly, the invention provides a method and structures for manufacturing transistor devices (e.g., MOS transistors) using strained silicon bearing materials. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of such devices on conventional bulk silicon. Conventional bulk silicon has been used for numerous years. As devices become smaller, however, conventional bulk silicon has limitations. These limitations include isolation problems between transistor device structures. Additionally, conventional bulk silicon has imperfections, which lead to limitations with device speed and reliability issues. These and other limitations will be described in further detail throughout the present specification and more particularly below.

From the above, it is seen that an improved technique for processing semiconductor devices is desired

BRIEF SUMMARY OF THE INVENTION

According to the present invention, techniques directed to integrated circuits and their processing for the manufacture of semiconductor devices are provided. More particularly, the invention provides a method and structures for manufacturing transistor devices (e.g., MOS transistors) using strained silicon bearing materials. But it would be recognized that the invention has a much broader range of applicability.

In a specific embodiment, the present invention provides a method of manufacturing an integrated circuit on semiconductor substrates, e.g., silicon wafers. The method includes providing a semiconductor substrate characterized by a first lattice with a first structure and a first spacing. In a specific embodiment, the semiconductor substrate has an overlying film of material with a second lattice with a second structure and a second spacing, which places the film of material in a first tensile mode and/or compressive mode along the film surface crystal axes across a portion of the film of material relative to the semiconductor substrate with the first structure and the first spacing. The method includes patterning (e.g., etching) a predetermined region in a portion of the film of material to cause the first tensile mode to change to a second tensile mode in the patterned predetermined region if the portion of the film of material is in the first tensile mode or to cause the first compressive mode to change to a second compressive mode in a patterned predetermine region if the portion of the film of material is in the first compressive mode.

In an alternative specific embodiment, the present invention provides a method of manufacturing an integrated circuit on semiconductor substrates, e.g., silicon wafer. The method includes providing a semiconductor substrate characterized by a first lattice with a first structure and a first spacing. In a specific embodiment, the semiconductor substrate has an overlying film of material with a second lattice with a second structure and a second spacing, the second spacing placing the film of material in a strain mode characterized by a first tensile and/or compressive mode along a single film surface crystal axis across a first portion of the film of material relative to the semiconductor substrate with the first structure and the first spacing. The method patterns a predetermined region of the first portion of the film of material to cause the first tensile and/or compressive mode in the first portion of the film of material to change to a second tensile and/or compressive mode in a resulting patterned portion of the first portion of the film of material. In a preferred embodiment, the patterns are made using a masking and etching process.

Many benefits are achieved by way of the present invention over conventional techniques. For example, the present technique provides an easy to use process that relies upon conventional technology. In some embodiments, the method may provide higher device yields in dies per wafer. Additionally, the method provides a process that is compatible with conventional process technology without substantial modifications to conventional equipment and processes. Preferably, the method provides for certain regions of silicon that are compressed other regions that are tensile and still other regions that are neither depending upon the embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7-14 are examples of semiconductor substrates according to embodiments of the present invention; and FIGS. 15-19 are simplified diagrams of structures illustrating patterned strain silicon bearing materials according to an alternative embodiment of the present invention.

DETAILED DESCRIPTION OF THE INVENTION

According to the present invention, techniques directed to integrated circuits and their processing for the manufacture of semiconductor devices are provided. More particularly, the invention provides a method and structures for manufacturing transistor devices (e.g., MOS transistors) using strained silicon bearing materials. But it would be recognized that the invention has a much broader range of applicability.

A method of manufacturing an integrated circuit on semiconductor substrates is briefly outlined below.

According to the present invention, techniques directed to integrated circuits and their processing for the manufacture of semiconductor devices are provided. More particularly, the invention provides a method and structures for manufacturing transistor devices (e.g., MOS transistors) using strained silicon bearing materials. But it would be recognized that the invention has a much broader range of applicability.

A method of manufacturing an integrated circuit on semiconductor substrates is briefly outlined below.

1. Provide a semiconductor substrate characterized by a first lattice with a first structure and a first spacing;
2. Form an overlying film of material with a second lattice with a second structure and a second spacing, whereupon the second spacing placing the film of material in either a tensile or compressive mode across the entirety of the film of material relative to the semiconductor substrate with the first structure and the first spacing;
3. Process the film of material to form a first region and a second region within the film of material, whereupon the first region and the second region are characterized by either the tensile or compressive mode;
4. Process the first region of the film of material while maintaining the second region characterized by either the tensile or the compressive mode to form an opposite characteristic from the second region intact, whereupon the opposite characteristic is a tensile mode if the second region is in the compressive mode and the opposite characteristic is the compressive mode if the second region is in the tensile mode; and
5. Perform other steps, as desired.

The above sequence of steps provides a method according to an embodiment of the present invention. As shown, the method uses a combination of steps including a way of forming a region in tensile mode and another region in compressive mode for integrated circuits. Other alternatives can also be provided where steps are added, one or more steps are removed, or one or more steps are provided in a different sequence without departing from the scope of the claims herein. Further details of the present method can be found throughout the present specification and more particularly below.

Figure 1:
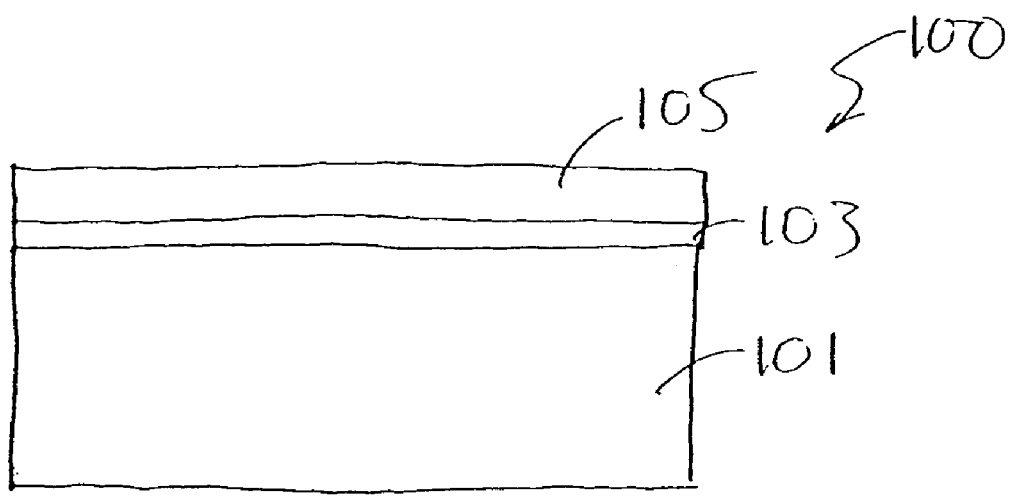
FIGS. 1 through 3 illustrate a method for forming integrated circuits according to an embodiment of the present invention.
Figure 2:
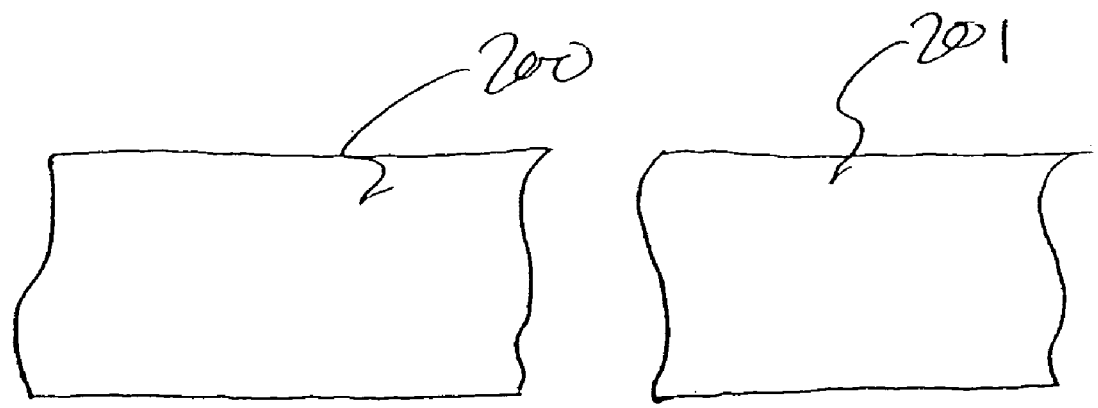
Figure 3:
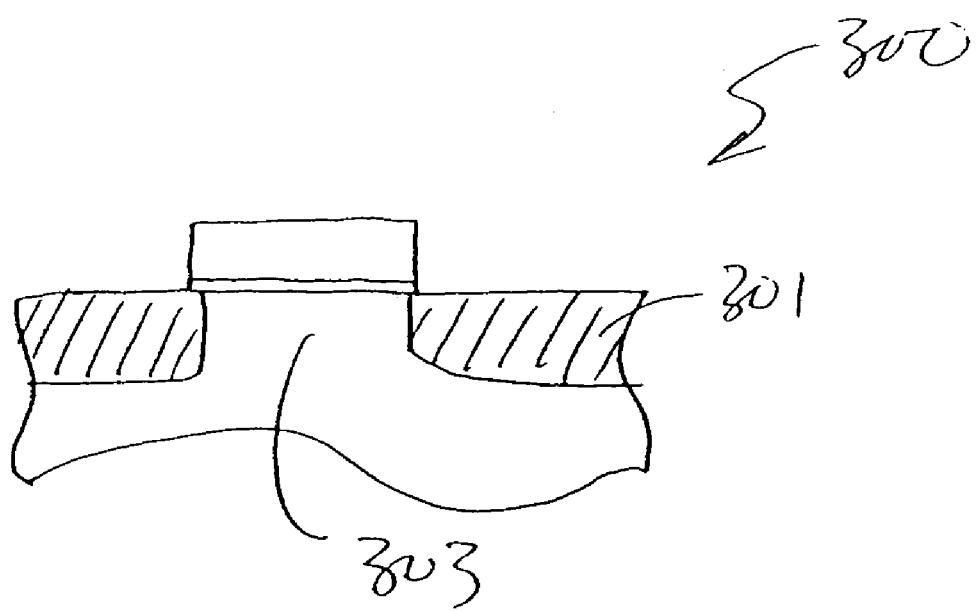

FIGS. 1 through 3 illustrate a method for forming integrated circuits according to an embodiment of the present invention. This diagram is merely an example, which should not unduly limit the scope of the claims herein. One of ordinary skill in the art would recognize other variations, modifications, and alternatives. As shown, the method 100 includes providing a semiconductor substrate 101 characterized by a first lattice with a first structure and a first spacing. Here, the semiconductor substrate can include silicon and other materials. The method includes forming an overlying film of material 105 with a second lattice with a second structure and a second spacing. Preferably, the layer of material is stressed silicon. Here, the second spacing placing the film of material in either a tensile or compressive mode across the entirety of the film of material relative to the semiconductor substrate with the first structure and the first spacing. The film of material is often formed on a film 103, which acts as an interface. Such film may include epitaxial silicon-germanium, oxide, any combination of these, and other like materials. That is, the strained silicon may be on an insulator material, e.g., silicon on insulator. The film of material can also be formed directly to the substrate without film 103, which makes film 105 directly and electrically connected to semiconductor substrate 101 according to a specific embodiment.

Referring to FIG. 2, the method includes processing the film of material to form a first region 200 and a second region 201 within the film of material. The first region and the second region are characterized by either the tensile or compressive mode. Depending upon the embodiment, the first region and the second region can be separate well regions or other like structures, depending upon the embodiment.

The method includes processing the first region of the film of material while maintaining the second region characterized by either the tensile or the compressive mode to form an opposite characteristic from the second region, whereupon the opposite characteristic is a tensile mode if the second region is in the compressive mode and the opposite characteristic is the compressive mode if the second region is in the tensile mode. Referring to the diagram 300 of FIG. 3, regions 301 can be provided into etched source/drain regions. Depending upon the characteristic of regions 301, channel region 303 can be either in a compressed or tensile mode. Regions 301 can be formed by epitaxial deposition processes or the like. An merely an example, such a technique for epitaxial deposition can be found in U.S. Pat. No. 6,621,131, assigned to Intel Corporation, as well as others. Certain local stresses are modified via capping layers (e.g., silicon nitride) and source/drain epitaxial deposition that modify unstressed bulk silicon to enhance device mobility. The characteristic of the channel region is opposite of the other regions. Depending upon the embodiment, there can be a single second region, which comprises more than one specific regions. Alternatively, there can be multiple second regions and multiple first regions. Other ways of changing a characteristic of the first region can also be provided. Such ways include forming a capping layer overlying completed MOS transistor devices. Capping layers include, among others, silicon nitride or other combination of such materials that cause a stained characteristic on the channel region. Depending upon the embodiment, the method also performs other steps, as desired.

An alternative method of manufacturing an integrated circuit on semiconductor substrates is briefly outlined below.

1. Provide a semiconductor substrate characterized by a first lattice with a first structure and a first spacing;
2. Form an overlying film of material with a second lattice with a second structure and a second spacing, whereupon the second spacing placing the film of material in either a tensile or compressive uniaxial or biaxial mode across the entirety of the film of material relative to the semiconductor substrate with the first structure and the first spacing;
3. Process a predetermined region in the film of material to cause the first tensile mode to increase to a second tensile mode if the film of material is in the first tensile mode or cause the first compressive mode to increase to a second compressive mode if the film of material is in the first compressive mode; and 4. Perform other steps, as desired.

The above sequence of steps provides a method according to an embodiment of the present invention. As shown, the method uses a combination of steps including a way of forming a region in tensile mode and another region in compressive mode for integrated circuits. Other alternatives can also be provided where steps are added, one or more steps are removed, or one or more steps are provided in a different sequence without departing from the scope of the claims herein. Further details of the present method can be found throughout the present specification and more particularly below.

Figure 4:
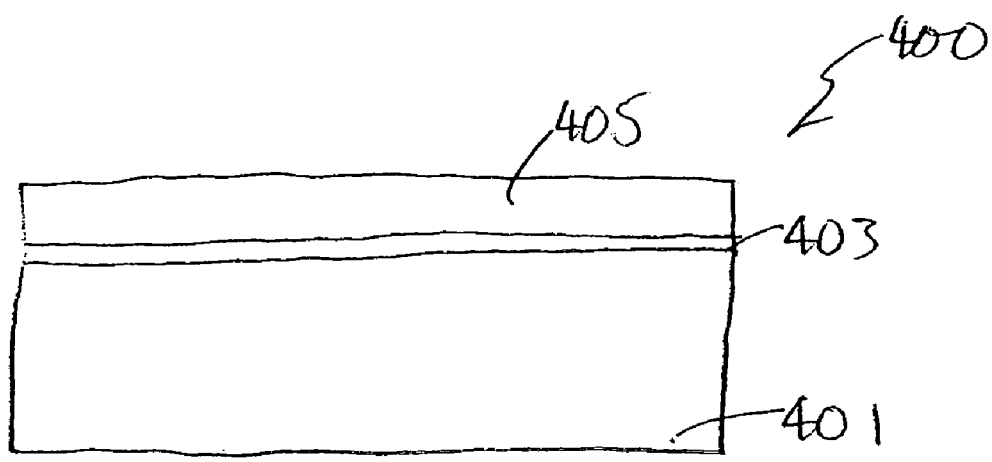
FIGS. 4 through 6 illustrate an alternative method for forming integrated circuits according to an embodiment of the present invention.
Figure 5:
Figure 6:
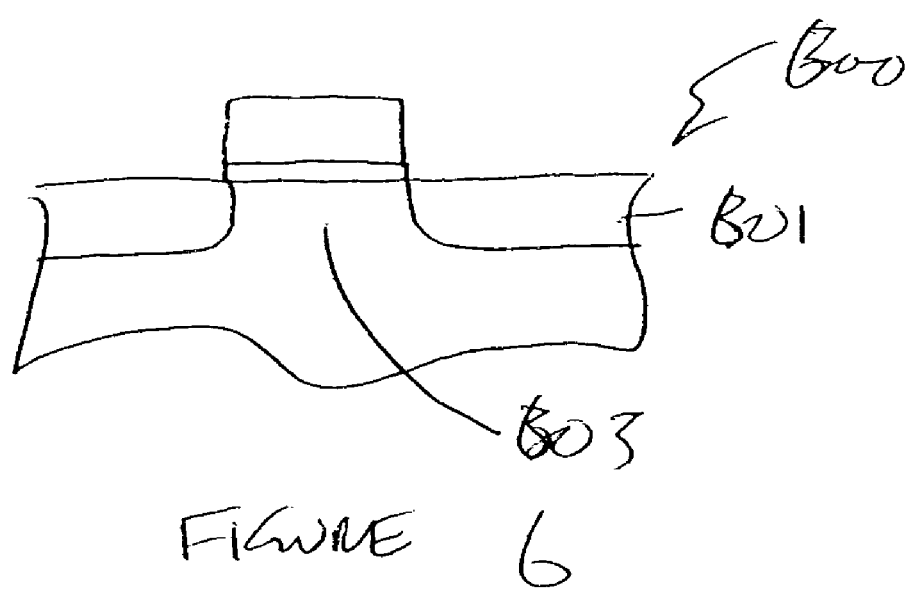
Figure 7:
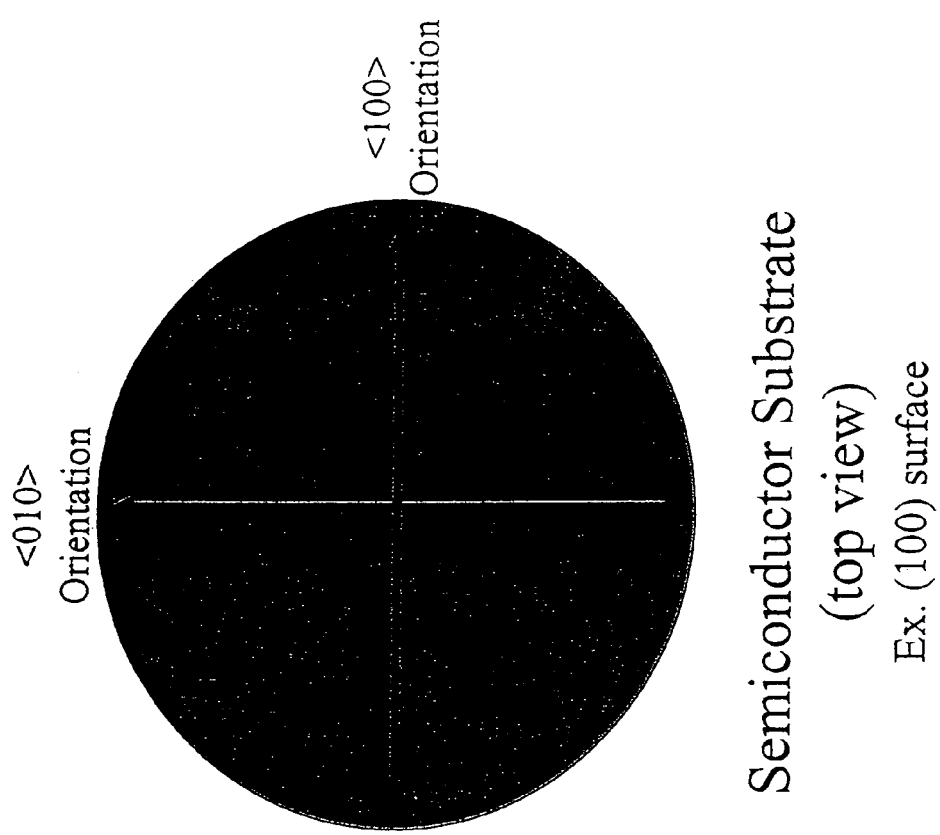
Figure 8:
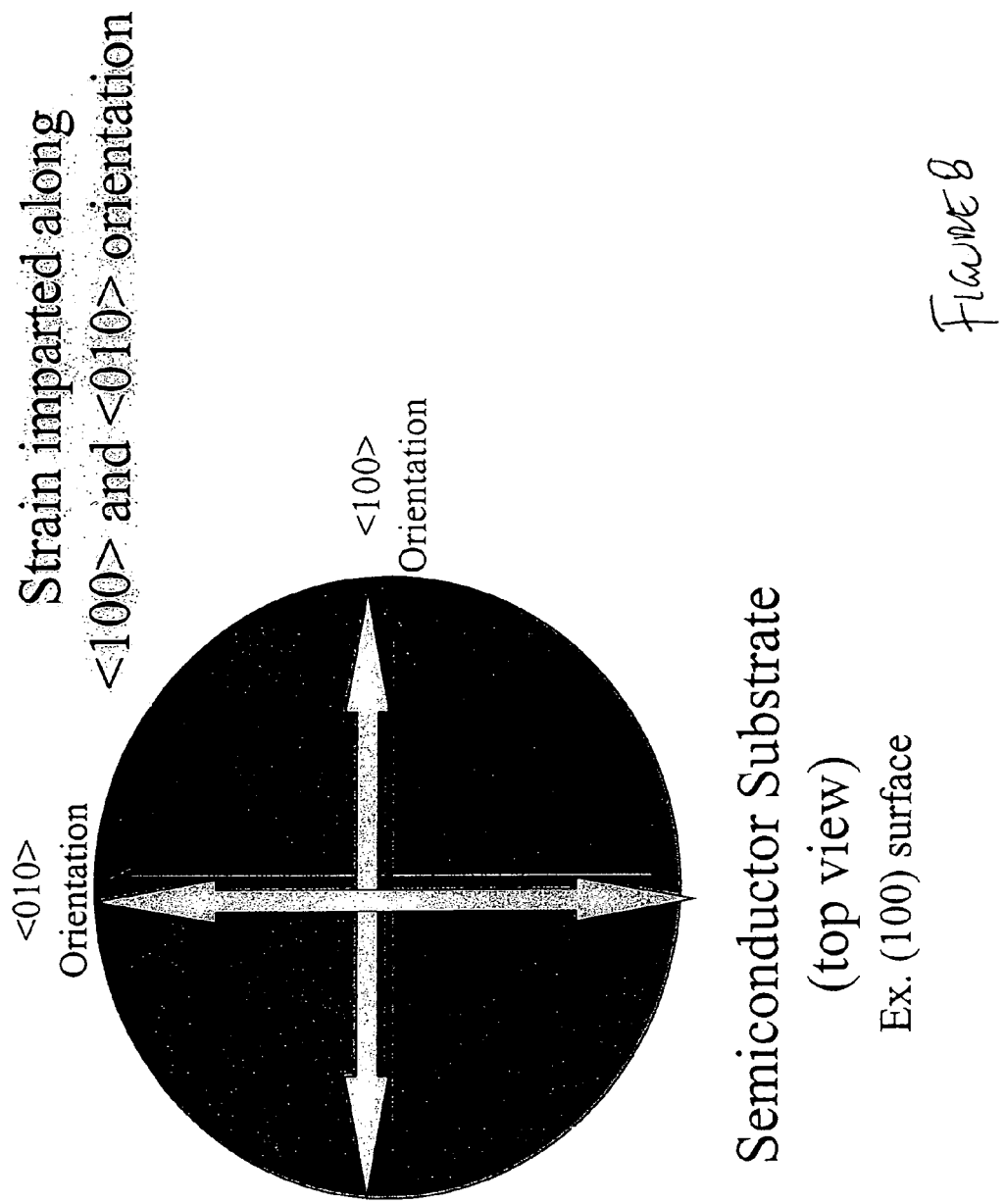
Figure 9:
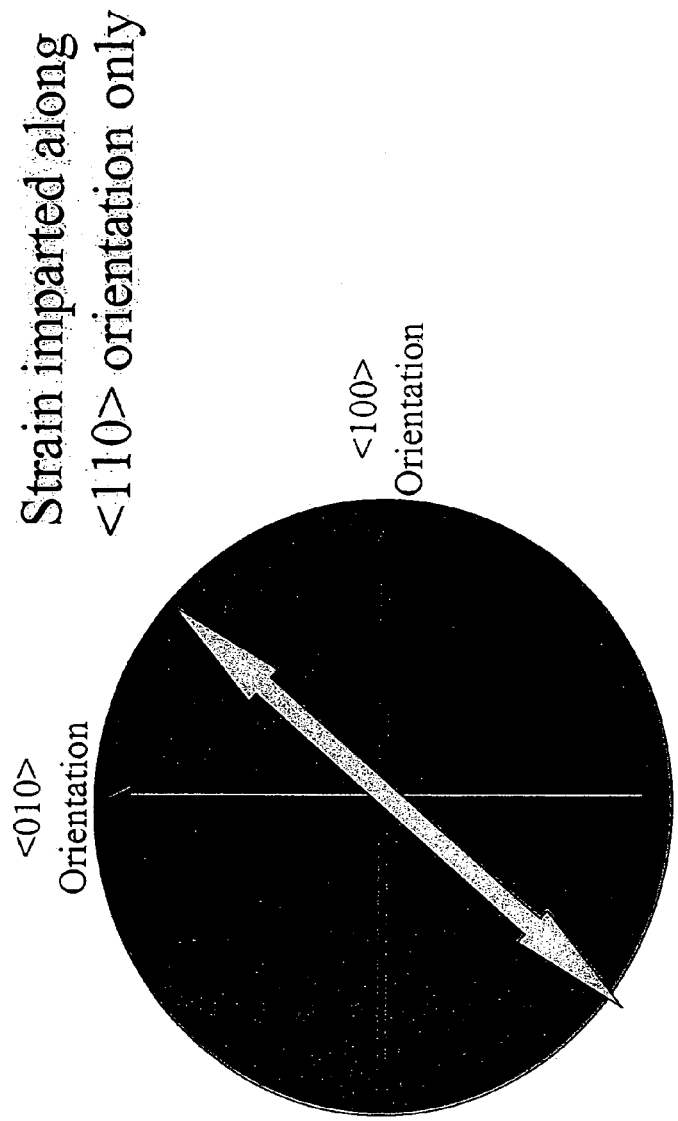
Figure 3:
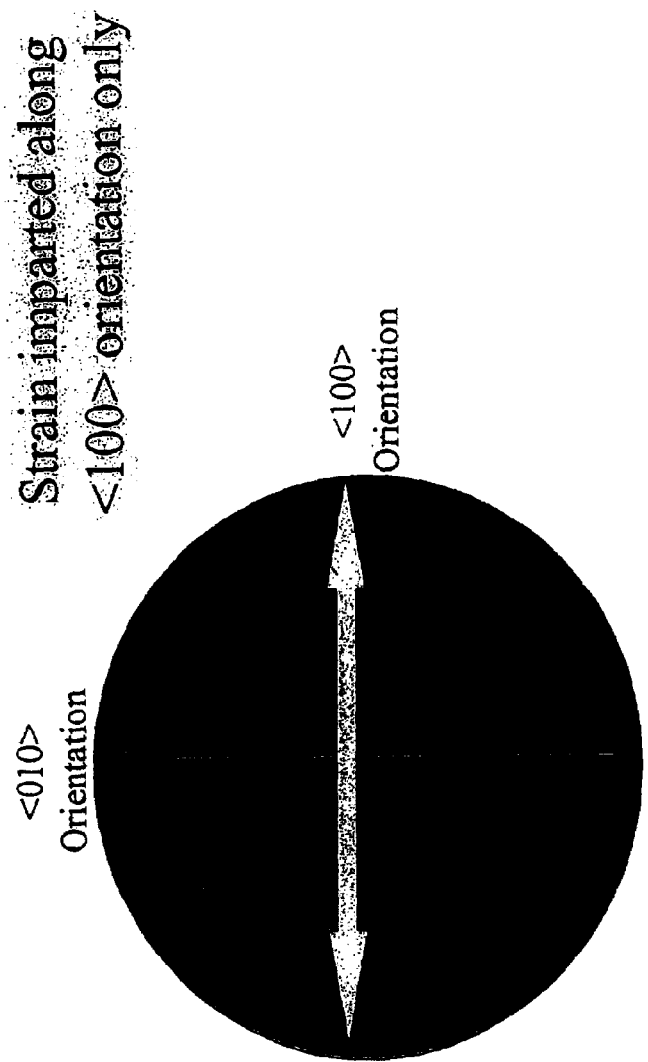
Figure 12:
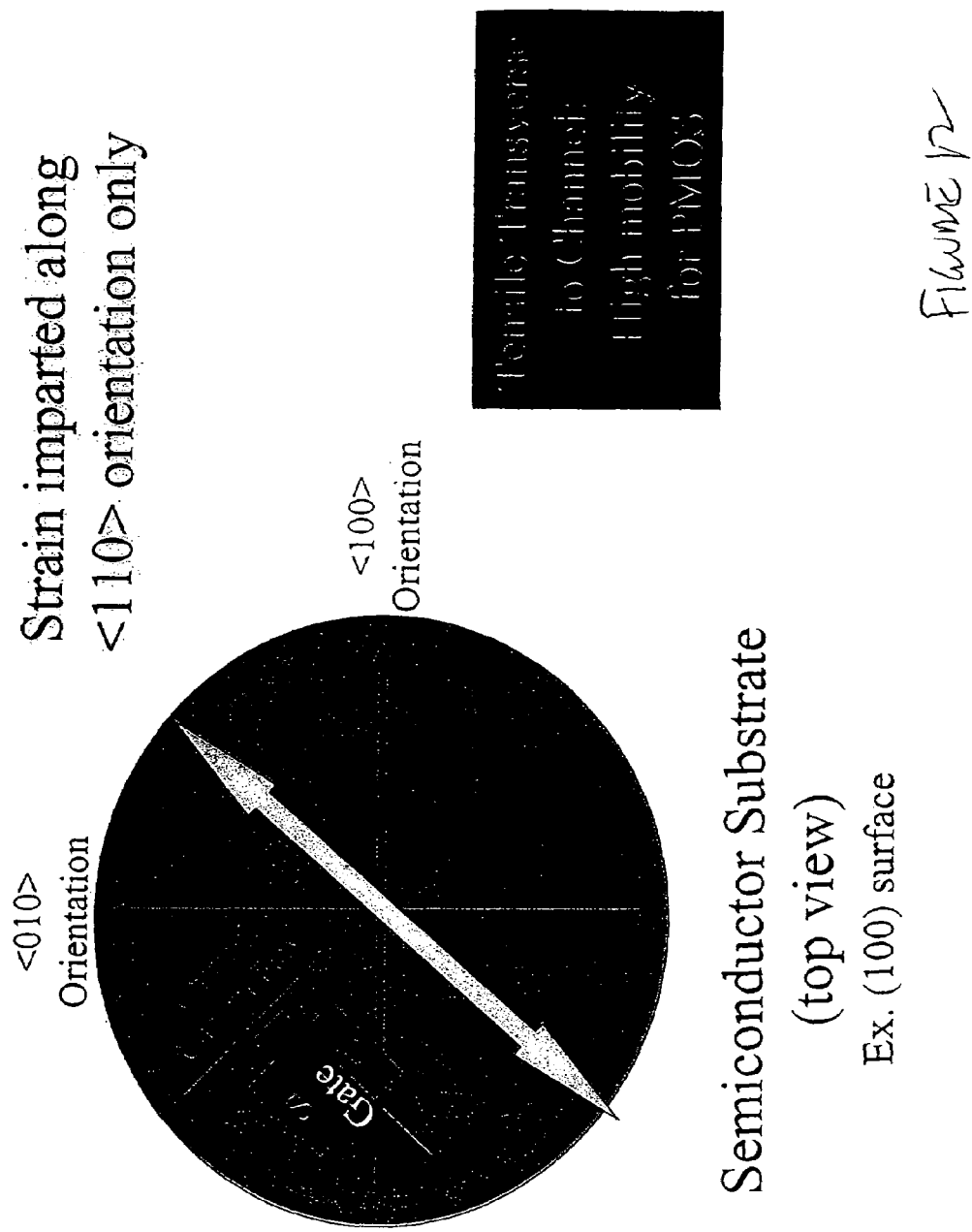
Figure 13:
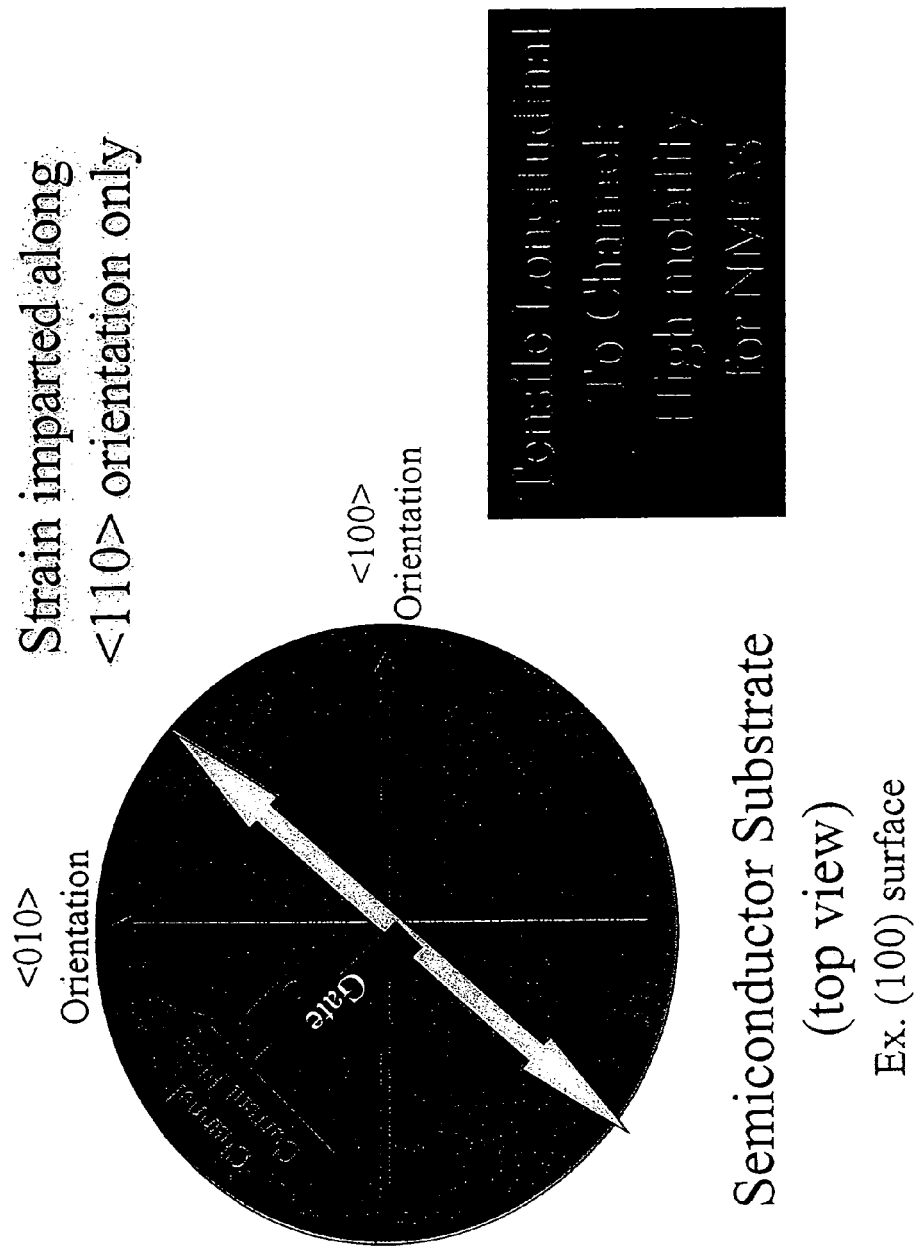
Figure 14:
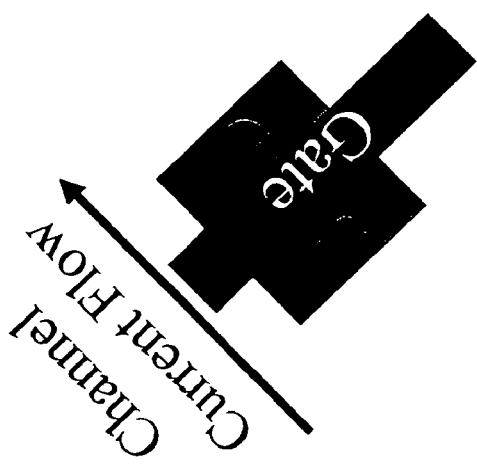

FIGS. 4 through 6 illustrate a method for forming integrated circuits according to an embodiment of the present invention. This diagram is merely an example, which should not unduly limit the scope of the claims herein. One of ordinary skill in the art would recognize other variations, modifications, and alternatives. As shown, the method 400 includes providing a semiconductor substrate 401 characterized by a first lattice with a first structure and a first spacing. Here, the semiconductor substrate can include silicon and other materials. The method includes forming an overlying film of material 405 with a second lattice with a second structure and a second spacing. Preferably, the film of material is strained silicon, strained germanium, or other types of materials. Here, the second spacing places the film of material in either a tensile or compressive mode across the entirety of the film of material relative to the semiconductor substrate with the first structure and the first spacing. In a specific embodiment, the strain may be uniaxial. Alternatively, the strain may be biaxial in other embodiments. The film of material is often formed on a film 403, which acts as an interface. Such interface film may include epitaxial silicon-germanium, oxide, any combination of these, and other like materials. That is, the strained silicon may be on an insulator material, e.g., silicon on insulator.

In a specific embodiment, the present invention may also include a film of material with finished semiconductor devices. The finished semiconductor device have been provided before a layer transfer process of such film onto a handle substrate. The finished semiconductor device may include top metallization and passivation in a specific embodiment. Depending upon the embodiment, the strained layer may be from a layer transfer process or other process. The strained layer may be free from electronic devices or include completed or partially completed electronic devices. Of course, one of ordinary skill in the art would recognize other variations, modifications, and alternatives.

Referring to FIG. 5, the method includes processing the film of material to form one or more predetermined regions 500, 501 within the film of material. The predetermined region(s) is processed to cause the first tensile mode to change to a second tensile mode if the film of material is in the first tensile mode. Alternatively, the predetermined region(s) is processed to cause the first compressive mode to change to a second compressive mode if the film of material is in the first compressive mode. Preferably, the second tensile mode provides a greater strain characteristic (e.g., absolute value, real value) in the predetermined region than the first tensile mode. The second compressive mode can provide a greater strain characteristic (e.g., absolute value, real value) in the predetermined region than the first compressive mode. Depending upon the embodiment, the predetermined region or regions can be separate well regions, channel regions, active regions, or other like structures, depending upon the embodiment.

For example, for an overlying film of material made of silicon with a (100) surface crystal orientation, a uniaxial tensile strain can be advantageously imparted along the <110> orientation to achieve significant transistor performance improvements for both NMOS and PMOS devices according to an embodiment of the present invention. For the PMOS devices, a significant mobility enhancement can be realized through the fabrication of the PMOS device with the source/drain (channel current flow) transverse to this <110> tensile stress direction according to an embodiment of the present invention. For the NMOS devices, all orientations will yield a mobility enhancement but the device may be best oriented with the source/drain (channel current flow) longitudinal to this <110> tensile stress direction according to an embodiment of the present invention.

Referring to the diagram 600 of FIG. 6, regions 601 can be provided into etched source/drain regions. Depending upon the characteristic of regions 601, channel region 603 can be either in a compressed or tensile mode. Regions 601 can be formed by epitaxial deposition processes or the like. The characteristic of the channel region can be in the second tensile mode or second compressive mode, while other regions of the film of material are in the first tensile mode or first compressive mode. Depending upon the embodiment, there can be a single predetermined region, which comprises more than one specific regions. Alternatively, there can be multiple predetermined regions. Other ways of changing a characteristic of the predetermined region can also be provided. Such ways include forming a capping layer overlying completed MOS transistor devices. The MOS devices can form memories, application specific integrated circuits, microprocessors, and the like. Alternatively, other types of devices can also include strain characteristics. Capping layers include, among others, silicon nitride or other combination of such materials that cause a strained characteristic on the channel region. The capping layers can provide tensile characteristics or possibly compressive characteristics to the underlying layers depending upon the type of capping layer and application. The capping layer can be blanket deposited and also patterned to provide certain desirable benefits. Depending upon the embodiment, the method also performs other steps, as desired.

FIGS. 7-14 are examples of semiconductor substrates according to embodiments of the present invention. These examples illustrate certain types of substrates that have been described herein. As will be noted, these are merely examples, which should not unduly limit the scope of the claims. One of ordinary skill in the art would recognize many variations, modifications, and alternatives.

Figure 15:
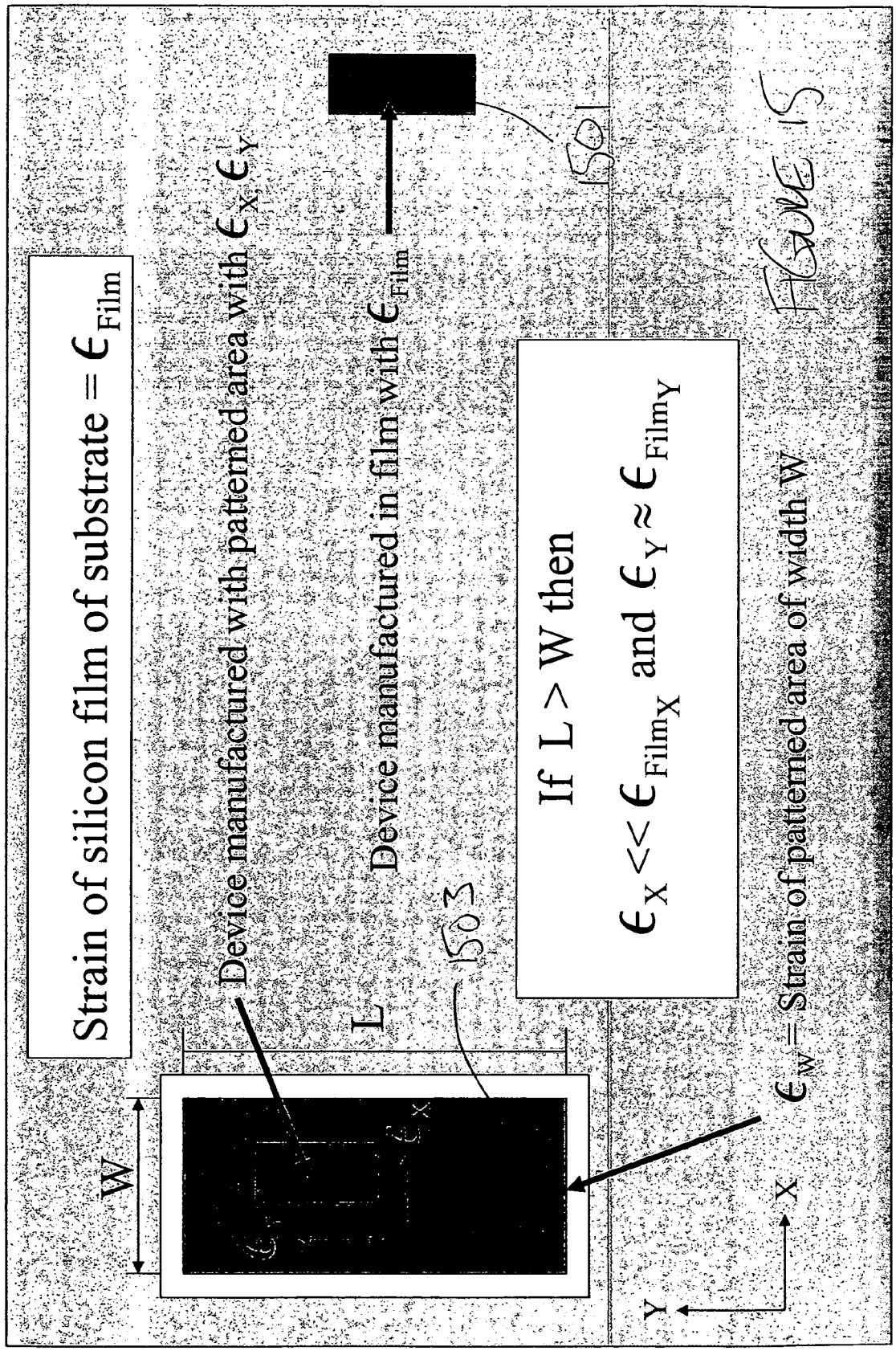

FIGS. 15-16 are simplified diagrams of structures illustrating patterned strain silicon bearing materials according to an alternative embodiment of the present invention. These diagrams are merely examples, which should not unduly limit the scope of the claims herein. One of ordinary skill in the art would recognize other variations, modifications, and alternatives. Referring to FIG. 15, the present structures include strained region 1503 with length L and width W, as shown. The strained region has strain defined as $\epsilon w$, which relates to strain on the patterned region with width W and length L. As noted, if L is greater than W, then the strain in the L direction is about the same whether the stain is derived from the larger patterned region of length L and width W or the smaller patterned film 1501. The smaller patterned film, however, has a much different strain characteristic in the X direction. Here, the strain in the smaller patterned film in the x direction is much less than the stain in the x direction of the larger patterned region of length L and width W according to a specific embodiment. The patterned region or area may be formed using any of the techniques described herein as outside of the present specification, according to a specific embodiment of the present invention.

In a specific embodiment, the present structures are manufactured using patterning and etching techniques. The present techniques include forming a masking layer, such as a photo masking material overlying surfaces of the patterned region of width W and length L. The masking material is exposed and developed. Etching techniques, either wet or dry or any combination of these, remove exposed portions of the patterned region. The patterning and etching techniques relaxes the strain in the x-direction for the smaller patterned film according to a preferred embodiment. Depending upon the embodiment, the stain can be either tensile or compressive.

In an alternative specific embodiment, the present structures include a first MOS transistor structure 1601 and a second MOS transistor structure 103. As shown, the channel length, which is subjected to strain, is similar in size L1 and L2. The strain is also similar according to a specific embodiment. The channel width W1 1609 of the first transistor structure is larger than the channel width W2 1611 of the second transistor structure according to a preferred embodiment of the present invention. Using a the same strained layer, the smaller channel width W2 yields a smaller level of strain according to a specific embodiment, than the stain in the larger channel width W1. Depending upon the embodiment, the stain can be either tensile or compressive. Details of the various structures and related methods of manufacture are described in more detail below.

In a specific embodiment, a process of stress relaxation can be accomplished by allowing a limited width of stressed material to be formed. In a sufficiently small width of material, the stored stresses are allowed to deform the structure according to an aspect of the present invention. This deformation can be plastic and permanent (i.e. by the movement of a relatively soft underlying layer such as glass or BPSG during a suitably elevated temperature treatment) or elastic (such as the deformation of tall, thin pillar structures to relax the upper region). In each of the cases, the effect would occur preferentially in the smaller width dimension. As merely an example, FIGS. 17 and 18 show simplified plastic and an elastic deformation of stressed films according to a preferred embodiment. As shown, the technique shows a stressed film in tensile mode, although other modes may exist. When an etched width 1701 of a stressed film is too large to accommodate any stress relaxation, any change in stress occurring within the film is small or non-existent. As the width becomes smaller 1703, stress relaxation mechanisms can occur and full relaxation occurs as the width become very small compared to the stressed film thickness, as shown. As also shown, a relaxed surface stress 1801 is also illustrated by way of FIG. 18.

Figure 19:
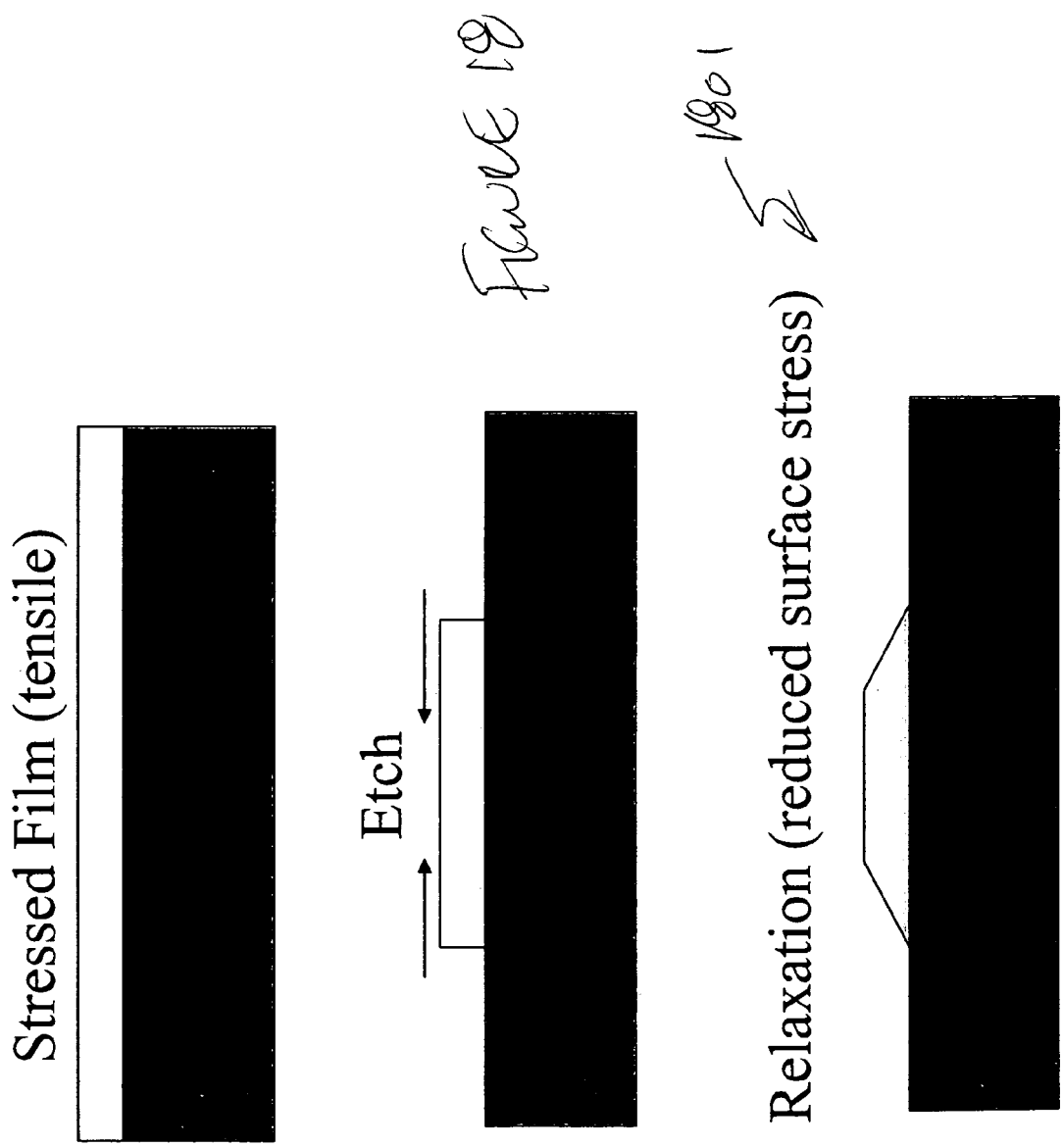
Figure 19:
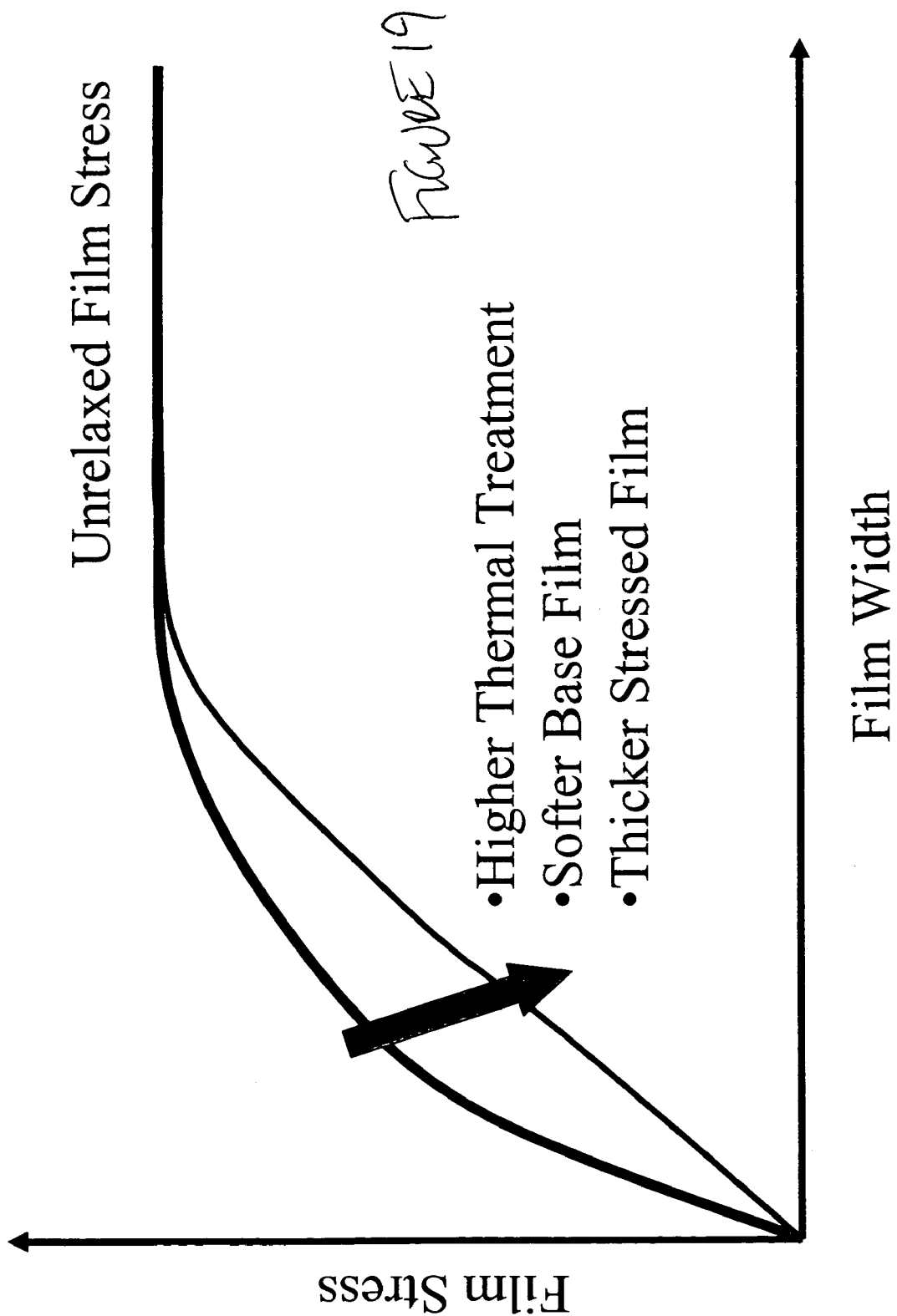

FIG. 19 is a simplified graph showing a phenomenological trend according to a specific embodiment. As shown, the graph illustrates film stress on a vertical axis, which intersects film width on a horizontal axis. Softer underlying structures, thicker stress layers and larger thermal treatments tend to allow the relaxation mechanism to occur at larger widths. As film width decreases, stress also decreases until no stress exists for very small dimensions, e.g., about a size of a single molecule. As merely an example, the elastic relaxation effect has been reported in low-width deep submicron MOS devices where the stresses were relaxed by the use of shallow trench isolation etched features (see, for example, Z. Krivokapic et al, "Strain Relaxation in Narrow Width Strained Silicon Devices with Poly and Metal Gates," 2004 Elec. Chem. Proc. Vol. 2004-07, pp. 459-469.). The stress reduction was shown to be over 80% in the transverse stress direction for a 150 nm device. The plastic relaxation effect was shown in a reverse method by relaxing a SiGe stressed layer on top of a relaxed silicon film layer on a BPSG layer. After thermal treatment, a force balance causes the SiGe layer to relax and the silicon layer to become stressed by plastically flowing against the soft BPSG layer. This effect was found to be highly width dependent and generally following the graph of FIG. 18 (see, for example, R. L. Peterson et al, "Crystal-Direction Dependence of Uniaxial Tensile Strain in Ultra-Thin SOI," Proc. IEEE International SOI Conference, pp. 39-41, 2004.). Depending upon the embodiment, there can be other variations, modifications, and alternatives.

Although the above has been described in terms of certain embodiments, there can be other variations, modifications, and alternatives. For example, the above has been described in terms of (100) surface orientation, it would be appreciated that other crystal orientations such as (110), (111), and possibly others can be used. Additionally, strain can be placed along any selected surface orientation depending upon the embodiment. Depending upon the embodiment, global and/or local stain can be provided using a variety of techniques such as those in U.S. patent application Ser. No. 11/043,477 filed Jan. 24, 2005, titled "Method and System for Fabricating Strained Layers for the Manufacture of Integrated Circuits," commonly assigned and hereby incorporated by reference herein, and U.S. patent application Ser. No. 11/104,298, filed Apr. 11, 2005, titled "Method and System for Lattice Space Engineering," commonly assigned, and hereby incorporated by reference for all purposes. Of course, one of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing an integrated circuit on semiconductor substrates, the method comprising:

providing a semiconductor substrate characterized by a first lattice with a first structure and a first spacing, the semiconductor substrate having an overlying film of material with a second lattice with a second structure and a second spacing, the second spacing placing the film of material in a first tensile mode and/or compressive mode along the film surface crystal axes across a portion of the film of material relative to the semiconductor substrate with the first structure and the first spacing; and patterning a predetermined region in a portion of the film of material to cause the first tensile mode to change to a second tensile mode in the patterned predetermined region if the portion of the film of material is in the first tensile mode or to cause the first compressive mode to change to a second compressive mode in a patterned predetermine region if the portion of the film of material is in the first compressive mode.

2. The method of claim 1 wherein the second spacing places the film of material in the tensile mode.

3. The method of claim 1 wherein the second spacing places the film of material in the compressive mode.

4. The method of claim 1 wherein the processing of the predetermined region comprises:
   forming a masking layer overlying the film of material; and
   etching the portion of the film of material to form the predetermined region.

5. The method of claim 4 wherein the etching comprises a wet etching process.

6. The method of claim 4 wherein the predetermined region comprises an exposed portion of the film of material.

7. The method of claim 1 wherein the predetermined region comprises an unexposed portion of the film of material.

8. The method of claim 1 wherein the film of material is strained silicon bearing material.

9. The method of claim 8 wherein the strained silicon bearing material is overlying an epitaxial silicon-germanium material, the epitaxial silicon-germanium material overlying the semiconductor substrate.

10. The method of claim 1 wherein the patterning of the predetermined region comprises a dry etching process.

11. The method of claim 1 wherein the patterning of the predetermined region comprises masking and dry etching.

12. The method of claim 1 wherein the first lattice structure is for a lattice structure for a silicon substrate and the second lattice structure is for a strained silicon material.

13. The method of claim 12 further comprising forming an insulating material overlying the semiconductor substrate, the insulating material being between the semiconductor substrate and the film of material.

14. The method of claim 13 wherein the film of material consisting of strained silicon bearing material is overlying an epitaxial silicon-germanium material.

15. The method of claim 1 wherein the first tensile and/or compressive mode is characterized by a uniaxial strain characteristic.

16. The method of claim 1 wherein the first tensile or compressive mode is characterized by a biaxial strain characteristic.

17. The method of claim 1 wherein the second compressive mode is characterized by a second strain value that has a higher absolute value than a first strain value of the first compressive mode.

18. The method of claim 1 wherein the second tensile mode is characterized by a second strain value that has a higher absolute value than a first strain value of the first tensile mode.

19. The method of claim 1 wherein the second compressive mode is characterized by a second strain value that has a higher real value than a first strain value of the first compressive mode.

20. The method of claim 1 wherein the second tensile mode is characterized by a second strain value that has a higher real value than a first strain value of the first tensile mode.

21. The method of claim 1 wherein the predetermined region is for a channel region of a transistor for a microprocessor device or a memory device or a logic device.

22. The method of claim 1 wherein the predetermined region is for a channel region having a channel length in a direction of a <110> crystal direction of the semiconductor substrate.

23. The method of claim 1 wherein the predetermined region is for a channel region having a channel length in an orthogonal direction of a <110> crystal direction of the semiconductor substrate.

24. The method of claim 1 wherein the predetermined region is for a channel region having a channel length in a <111> crystal direction of the semiconductor substrate.

25. The method of claim 1 wherein the predetermined region is for a channel region having a channel length in a <100> crystal direction of the semiconductor substrate.

* * * * *